United States Patent
Tamura

(10) Patent No.: US 7,876,178 B2
(45) Date of Patent: Jan. 25, 2011

(54) COMPOSITE FILTER COMPRISING A SURFACE ACOUSTIC WAVE FILTER AND AN LC FILTER

(75) Inventor: Masaya Tamura, Osaka (JP)

(73) Assignee: Panasonic Corporation, Osaka (JP)

( * ) Notice: Subject to any disclaimer, the term of this patent is extended or adjusted under 35 U.S.C. 154(b) by 435 days.

(21) Appl. No.: 12/065,767

(22) PCT Filed: Dec. 4, 2006

(86) PCT No.: PCT/JP2006/324159
§ 371 (c)(1),
(2), (4) Date: Mar. 5, 2008

(87) PCT Pub. No.: WO2007/066608
PCT Pub. Date: Jun. 14, 2007

(65) Prior Publication Data
US 2009/0278629 A1 Nov. 12, 2009

(30) Foreign Application Priority Data
Dec. 6, 2005 (JP) .............................. 2005-351680

(51) Int. Cl.
*H03H 9/64* (2006.01)
*H03H 9/72* (2006.01)
(52) U.S. Cl. ........................ 333/193; 333/133
(58) Field of Classification Search ................. 333/133, 333/193–196; 310/313 B, 313 D
See application file for complete search history.

(56) References Cited

U.S. PATENT DOCUMENTS 6,489,861 B2 * 12/2002 Noguchi et al. ............. 333/133
6,756,864 B2 * 6/2004 Muramatsu ................. 333/133
2004/0227586 A1 * 11/2004 Taniguchi et al. ........... 333/133
2006/0091977 A1 * 5/2006 Inoue et al. ................. 333/133

FOREIGN PATENT DOCUMENTS

| JP | 5-083084 | | 4/1993 |
|---|---|---|---|
| JP | 7-007369 | | 1/1995 |
| JP | 09-098046 | * | 4/1997 |
| JP | 9-098056 | | 4/1997 |
| JP | 2000-077967 | | 3/2000 |
| JP | 2000-114917 | | 4/2000 |
| JP | 2004-254257 | | 9/2004 |
| JP | 2005-184773 | | 7/2005 |

OTHER PUBLICATIONS

English language Machine translation of JP 2000-077967 published Mar. 14, 2000.*
International Search Report issued Feb. 20, 2007 in the International (PCT) Application of which the present application is the U.S. National Stage.

* cited by examiner

*Primary Examiner*—Barbara Summons
(74) *Attorney, Agent, or Firm*—Wenderoth, Lind & Ponack, L.L.P.

(57) ABSTRACT

A composite filter downsized without degrading its characteristics is disclosed. The filter includes a surface acoustic wave filter and an LC filter coupled to the surface acoustic wave filter. The LC filter is formed by combining a π-shaped LC filter formed of two capacitors and an inductor coupled together in a π-shape with a capacitor coupled in parallel to the inductor. The two capacitors of the π-shaped LC filter are placed on a piezoelectric substrate with their comb-shaped electrodes opposed to each other. This opposing direction differs from an opposing direction of comb-shaped electrodes of a surface acoustic wave resonator.

3 Claims, 6 Drawing Sheets

COMPOSITE FILTER COMPRISING A SURFACE ACOUSTIC WAVE FILTER AND AN LC FILTER

TECHNICAL FIELD

The present invention relates to a composite filter to be used in communication devices such as mobile phones.

BACKGROUND ART

A conventional composite filter used in portable wireless communication devices such as mobile phones is described with reference to FIG. 9, which shows its perspective exploded view. In FIG. 9, the conventional composite filter is formed of a combination of an elastic surface-wave filter and a low-pass filter.

The low-pass filter is formed by combining an inductor with a capacitor, and is embedded in laminated substrate 2 made of low temperature co-fired ceramics and formed by layering a plurality of dielectric layers 1. The inductor is formed of a plurality of dielectric layers 1 with arc-shaped conductors 3 formed thereon and coupled to each other. The capacitor is formed of planar capacitor electrodes 4 sandwiching dielectric layer 1.

The elastic surface-wave filter is formed by combining elastic surface-wave resonators 5 in a ladder shape as shown in FIG. 10, and placing resonators 5 on laminated substrate 2.

The low-pass filter is coupled to a transmission output side of the foregoing filter in order to attenuate the doubled or tripled harmonics in the pass band of the filter. The composite filter discussed above, however, is formed by embedding the low-pass filter in laminated substrate 2, so that the inductor and the capacitor are obliged to occupy a large area, and the capacitor, in particular, takes a greater portion of the occupied area because its capacitance is proportionate to its area. As a result, the filter cannot be further downsized.

The art related to the present invention is listed here as patent documents 1 and 2.

Patent Document 1: Unexamined Japanese Patent Publication No. 2004-254257

Patent Document 2: Unexamined Japanese Patent Publication No. 2005-184773

SUMMARY OF THE INVENTION

The present invention addresses the foregoing problem and aims to provide a composite filter downsized from the conventional one without degrading the characteristics. To achieve this objective, the present invention employs the following structure: at least one of capacitors is placed such that its comb-shaped electrodes are oppositely placed to each other on a piezoelectric substrate, and the opposing direction of the comb-shaped electrodes differs from that of comb-shaped electrodes of a surface acoustic wave resonator.

The foregoing structure allows for a decrease in the area occupied by the capacitors because at least one of the capacitors is formed such that its comb-shaped electrodes oppose each other on the piezoelectric substrate. On top of that, unlike the comb-shaped electrodes of the surface acoustic wave resonator, the structure allows the comb-shaped electrodes of the capacitors to not be excited because its opposing direction differs from that of the comb-shaped electrodes of the surface acoustic wave resonator, so that no loss is produced. As a result, a downsized composite filter can be obtained without degrading the characteristics.

DETAILED DESCRIPTION OF THE INVENTION

Figure 1:
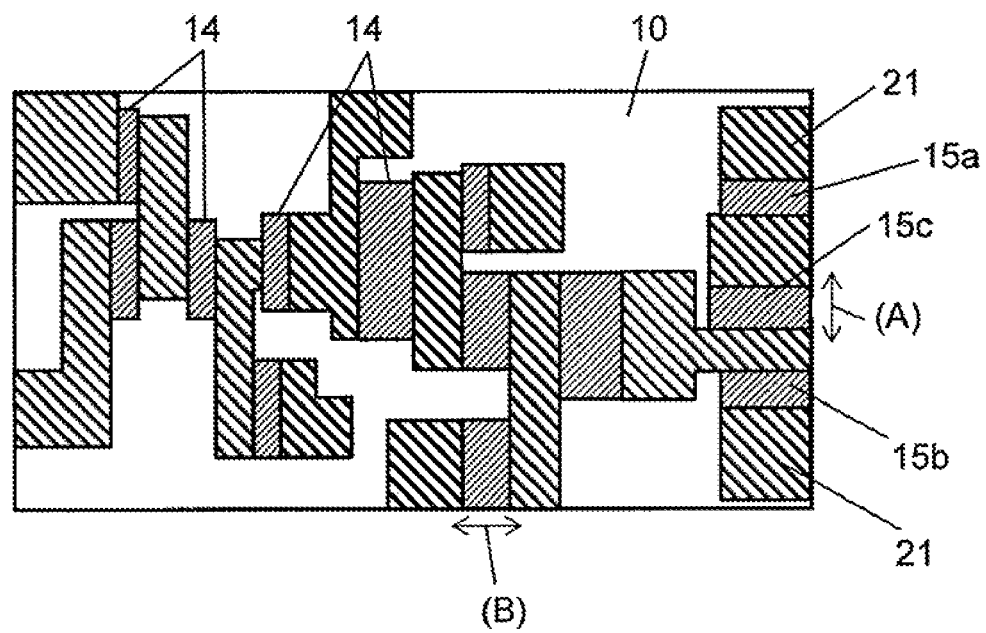
FIG. 1 shows a top view of a composite filter in accordance with an exemplary embodiment of the present invention.
Figure 2:
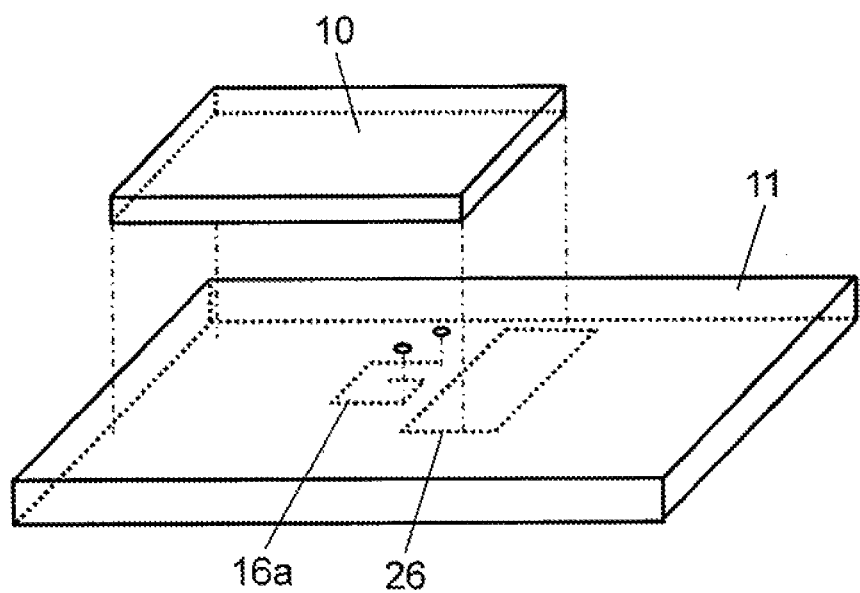
FIG. 2 shows an exploded perspective view of the composite filter in accordance with an embodiment of the present invention.
Figure 3:
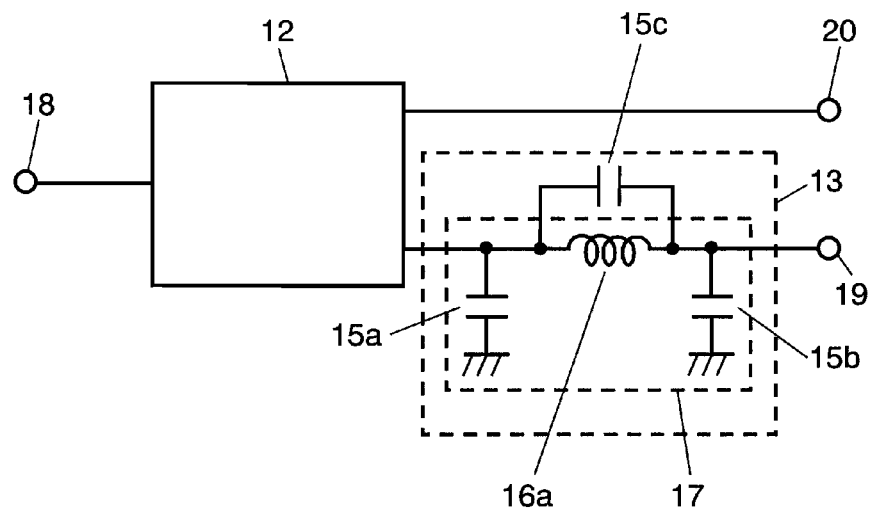
FIG. 3 shows an equivalent circuit diagram of the composite filter in accordance with an embodiment of the present invention.
Figure 4:
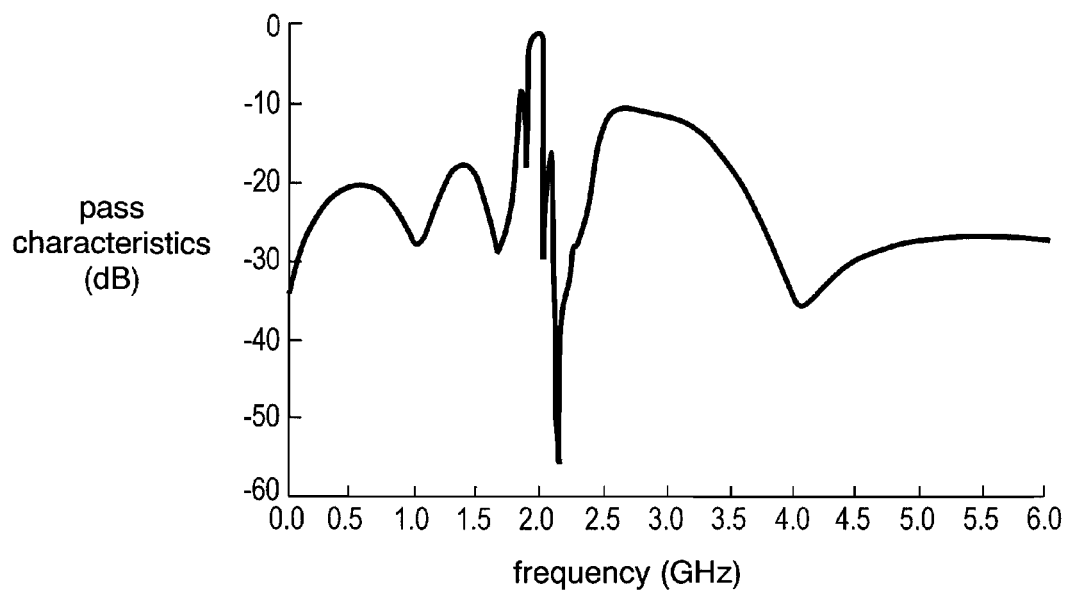
FIG. 4 shows frequency characteristics of the composite filter in accordance with an embodiment of the present invention.

An exemplary embodiment of the present invention is demonstrated hereinafter with reference to the accompanying drawings. FIG. 1 shows a top view of a composite filter in accordance with an embodiment of the present invention. FIG. 2 shows an exploded perspective view of the composite filter. FIG. 3 shows an equivalent circuit diagram of the composite filter. FIG. 4 shows frequency characteristics of the composite filter.

In FIG. 1-FIG. 3, the composite filter comprises the following elements:
  piezoelectric substrate 10 made from LiTaO$_3$;
  laminated substrate 11 made from ceramic baked at a low temperature, and on which substrate 11 piezoelectric substrate 10 is layered;
  surface acoustic wave filter 12; and
  LC filter 13 coupled to surface acoustic wave filter 12.

Elastic surface-wave filter 12 is formed by combining surface acoustic wave resonators 14 placed on piezoelectric substrate 10 such that their comb-shaped electrodes oppose to each other. LC filter 13 is formed by combining π-shaped LC filter 17 with capacitor 15c, where filter 17 is formed of capacitors 15a and 15b coupled to inductor 16a in a π-shape, and capacitor 15c is coupled in parallel to this inductor 16a.

This π-shaped LC filter 17 is configured by connecting respective first ends of capacitors 15a and 15b to inductor 16a, and respective second ends thereof are grounded. Each one of two capacitors 15a and 15b is configured by placing its comb-shaped electrodes opposing each other on piezoelectric substrate 10, and the opposing direction (A) of the comb-shaped electrodes differs orthogonally from the opposing direction (B) of the comb-shaped electrodes of surface acoustic wave resonator 14. Inductor 16a is embedded in laminated substrate 11 in a spiral shape. Capacitor 15c placed in parallel with inductor 16a is also configured by placing its electrodes opposing each other on piezoelectric substrate 10, and the opposing direction (A) of its electrodes orthogonally differs from the foregoing opposing direction (B).

As shown in FIG. 1, grounding conductors 21 are formed on piezoelectric substrate 10 at places other than where conductors 21 face a top face or an underside of inductor 16a embedded in laminated substrate 11; in other words, conductors 21 are placed anywhere on substrate 10 except just above or under inductor 16a. Capacitors 15a and 15b of π-shaped LC filter 17 are coupled to grounding conductors 21.

The structure discussed above allows for decreasing of a parasitic capacitance generated between inductor 16a and grounding conductor 21, and suppressing ripples to be generated in the pass band.

The composite filter further includes antenna terminal 18 disposed at a first end of surface acoustic wave filter 12, and transmission terminal 19 disposed at a first portion of a second end thereof via LC filter 13, and reception terminal 20 disposed at a second portion of the second end of surface acoustic wave filter 12. If the reception side wants to attenuate a higher frequency band than the pass band, LC filter 13 connected between the reception terminal and the terminal of the surface acoustic wave filter will achieve this task. If both of the reception side and the transmission side want to attenuate a higher frequency band than the pass band, LC filter 13 connected between the antenna terminal and the terminal of the surface acoustic wave filter will achieve this task.

The composite filter discussed above has the frequency characteristics as shown in FIG. 4, so that the filter can attenuate a large amount outside the pass band without degrading the waveform of the pass band. Assuming that the pass band is 2 GHz, the harmonics can be attenuated by approx. 35 dB at 4 GHz (twice of 2 GHz) and 20 dB at 6 GHz (triple of 2 GHz).

Unlike the conventional composite filter formed of planar capacitor electrodes opposing each other, capacitors 15a-15c can be formed on a highly dielectric piezoelectric-substrate by using a fine patterning similar to the surface acoustic wave resonator, so that capacitors 15a-15c can be placed to occupy a smaller area. Particularly the opposing direction (A) of comb-shaped electrodes of capacitors 15a-15c is different from that (B) of comb-shaped electrodes of resonator 14, so that the comb-shaped electrodes of capacitors 15a-15c do not become excited unlike resonator 14, of which comb-shaped electrodes become excited. Each one of capacitors 15a-15c thus can always work as a capacitor regardless of frequencies.

For instance, use of the foregoing composite filter in UMTS (Universal Mobile Telecommunications Systems), a kind of mobile telephones and the third generation of mobile communication system in Europe, allows the outer dimensions of the filter to be approx. 30 µm×220 µm. Use of the conventional composite filter embedded in the laminated substrate, of which relative dielectric constant is 7.4 makes its outer dimensions approx. 350 µm×330 µm. The occupied area of the composite filter of the present invention is thus as small as approx. 1/18 of the conventional one.

Figure 5:
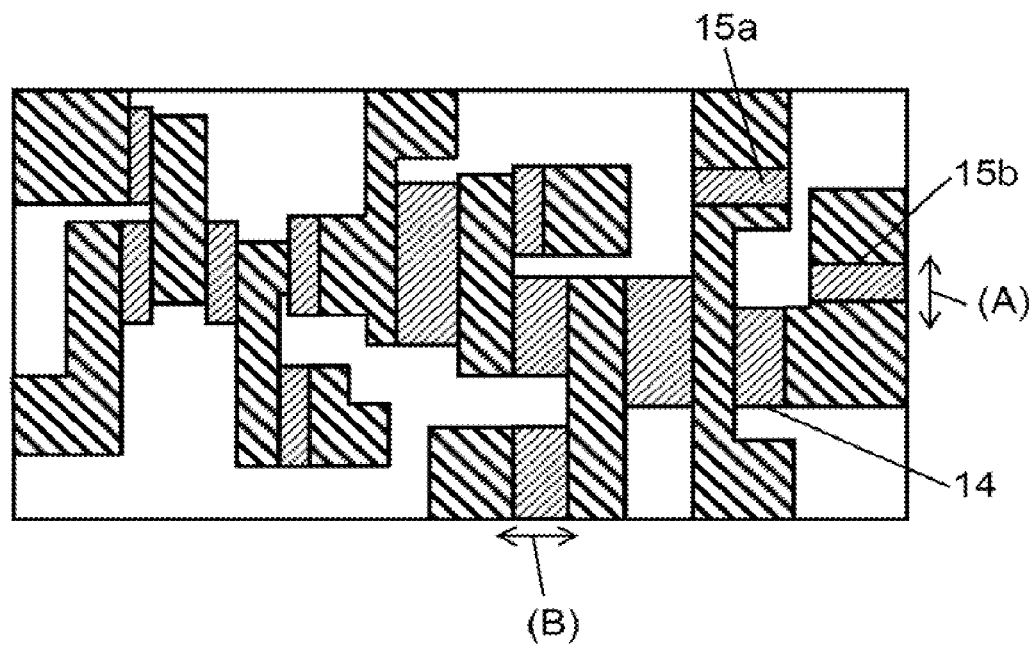
FIG. 5 shows a top view of a composite filter in accordance with another exemplary embodiment of the present invention.
Figure 6:
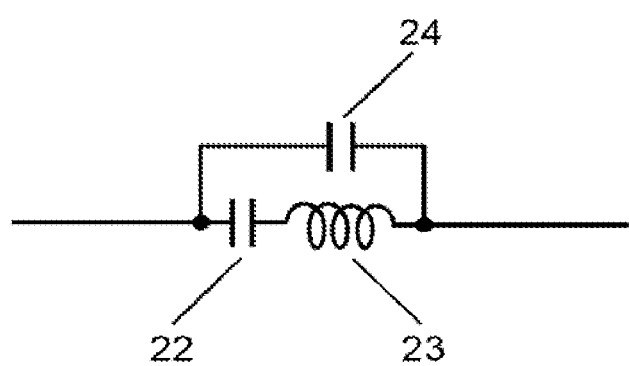
FIG. 6 shows an equivalent circuit diagram of a surface acoustic wave resonator.

As shown in FIG. 5, when capacitor 15c is replaced with surface acoustic wave resonator 14, the resonator can be expressed as an equivalent circuit shown in FIG. 6, namely, capacitor 24 is connected in parallel with a series circuit formed of capacitor 22 and inductor 23. Therefore, an anti-resonant frequency can be created on both the low frequency band and the high frequency band with inductor 16a, which is coupled in parallel to resonator 14, without changing a capacitance of surface acoustic wave resonator 15 while the capacitance of an equivalent circuit of resonator 14 is kept equivalent to that of capacitor 15. At the same time, the anti-resonant frequency can be changed with a value of the inductor without changing the resonance frequency. The equivalent circuit of resonator 14 thus can produce a similar effect to that of capacitor 15c in the vicinity of the pass band. On top of that, signals in a lower band than the pass band can be attenuated by an anti-resonant frequency created by the inductor on the lower band side.

Figure 7:
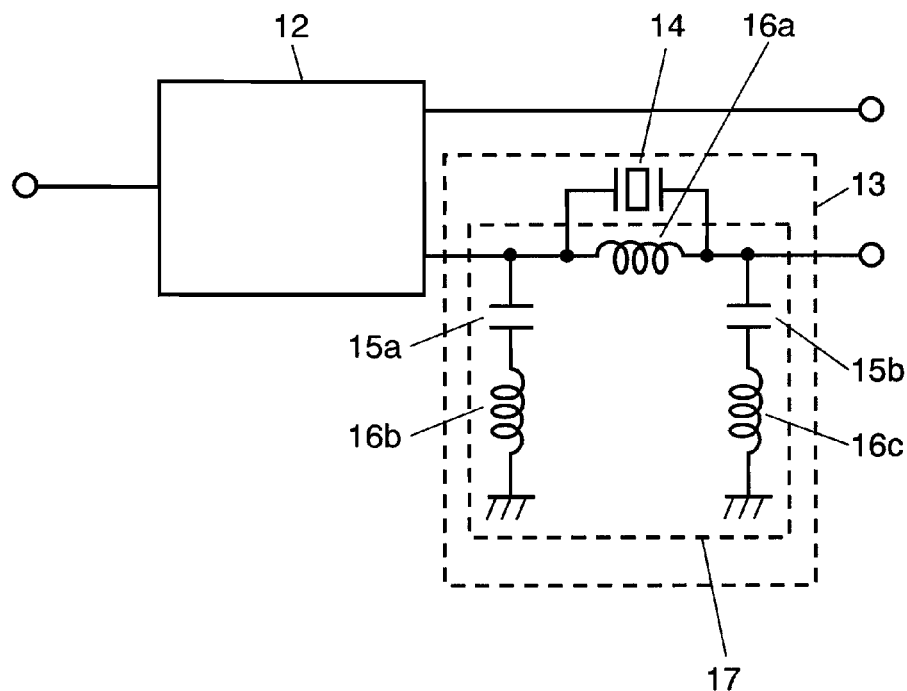
FIG. 7 shows an equivalent circuit diagram of a composite filter in accordance with another embodiment of the present invention.

Laminated substrate 11 includes another grounding conductor 26 embedded therein other than grounding conductor 21 formed on piezoelectric substrate 10 (see FIG. 2), and connecting of these two grounding conductors to each other allows for producing of inductors 16b and 16c between these conductors as shown in FIG. 7. Resonance between inductors 16b, 16c and capacitors 15a, 15b thus can be positively used, so that the values of capacitors 15a, 15b and capacitance that resonator 14 has, and respective values of inductors 16a-16c can be designed for these elements to form a polarized low-pass filter.

Figure 8:
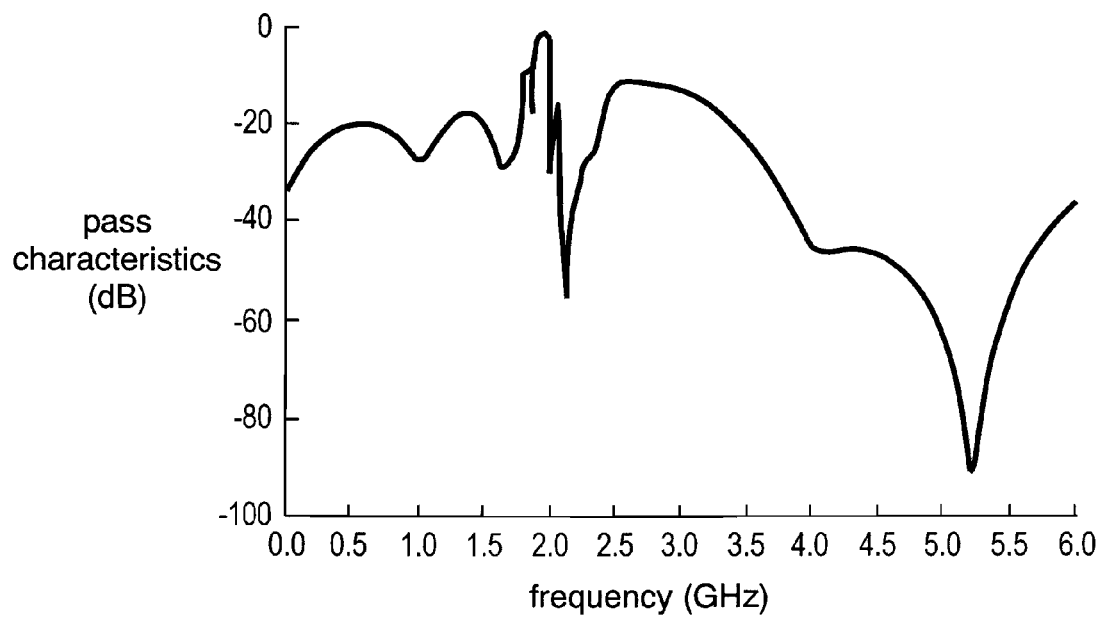
FIG. 8 shows frequency characteristics of a composite filter in accordance with another embodiment of the present invention.
Figure 9:
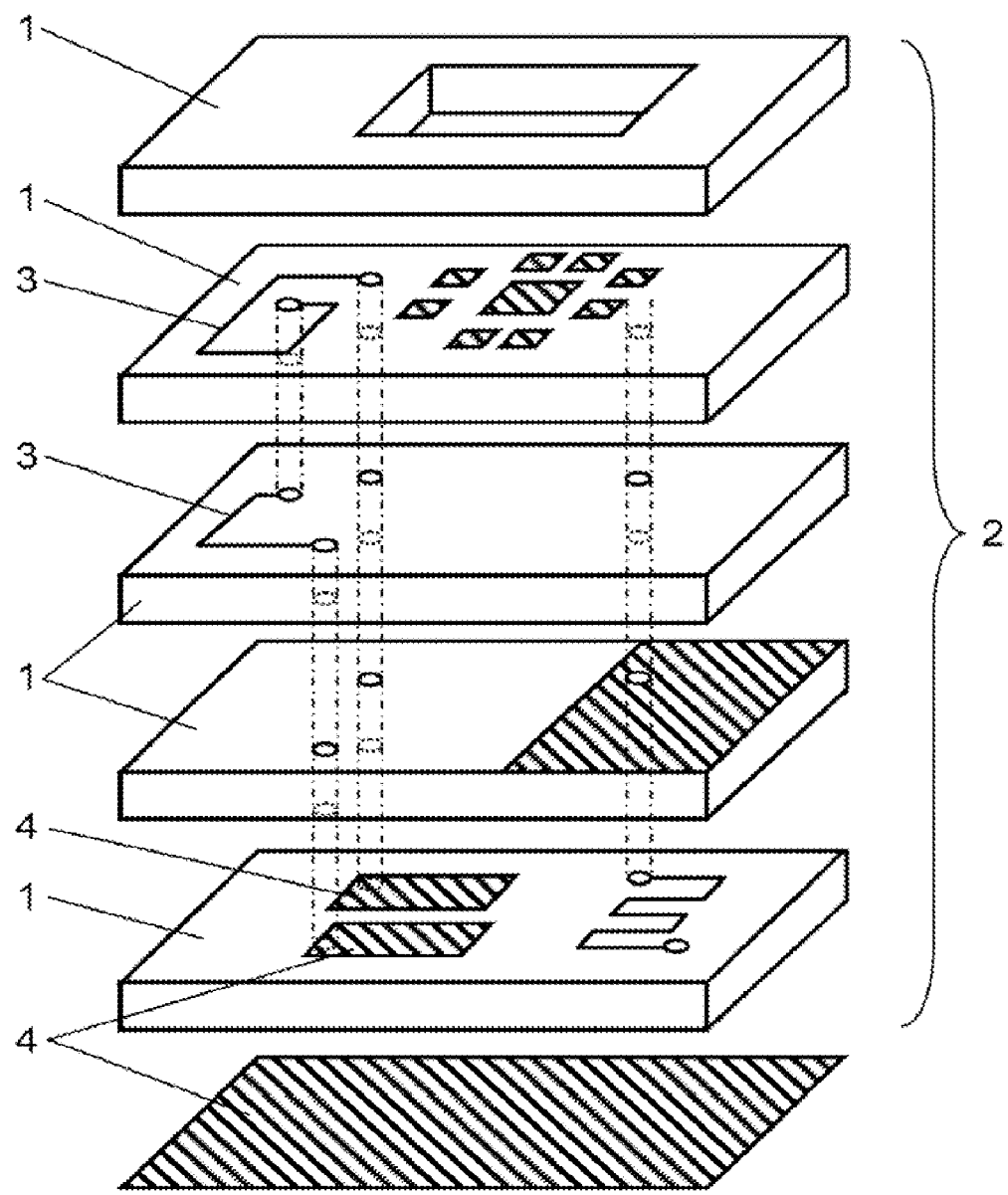
FIG. 9 shows an exploded perspective view of a conventional composite filter.
Figure 10:
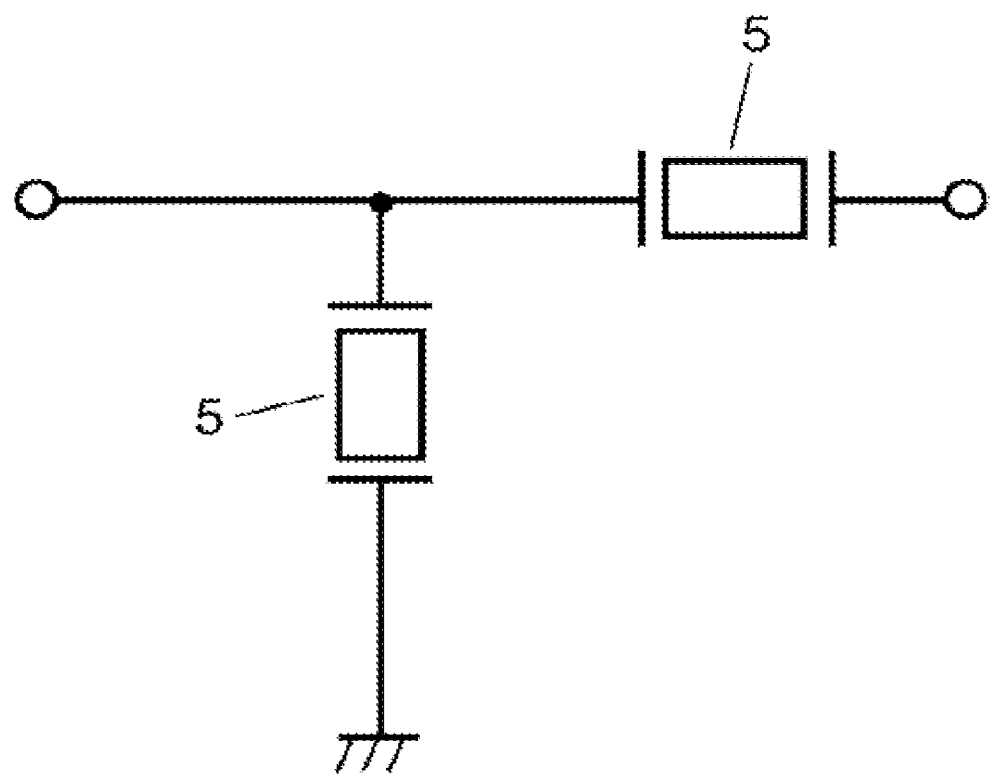
FIG. 10 shows an equivalent circuit diagram of a surface acoustic wave filter used in the conventional composite filter.

The composite filter discussed above has the frequency characteristics as shown in FIG. 8, and can attenuate a large amount of signals outside the pass band without degrading the waveform of the frequency characteristics in the pass band. For instance, assuming that the pass band is 2 GHz, compared with a typical surface acoustic wave filter, the foregoing composite filter can attenuate the signals outside the pass band by approx. 40 dB at 4 GHz (twice of 2 GHz), and approx. 30 dB at 6 GHz (triple of 2 GHz).

From the standpoint of capacitance, the comb-shaped electrodes of capacitors 15a-15c can be covered with dielectric such as $SiO_2$ or $SiN$ for increasing their capacitances, and this preparation can also suppress the dispersion of the capacitances due to changes in temperature.

Inductor 16a can be formed of strip lines having equivalent dielectric to that of the equivalent circuit of resonator 14 at a given frequency, or formed of chip inductors for obtaining a higher Q value, or formed on piezoelectric substrate 10 instead of embedded in laminated substrate 11 in order to downsize the filter.

The composite filter of the present invention can be used in communication devices such as mobile phones.

What is claimed is:
1. A composite filter comprising:
a piezoelectric substrate;
a surface acoustic wave filter;
an LC filter coupled to the surface acoustic wave filter; and
a laminated substrate;
wherein the surface acoustic wave filter is formed by combining surface acoustic wave resonators having comb-shaped electrodes that oppose each other along a first opposing direction on the piezoelectric substrate;
wherein the LC filter comprises a π-shaped LC filter formed of a first capacitor and a second capacitor coupled to an inductor in a π-shape, and a third capacitor coupled in parallel to the inductor;
wherein at least one of the first, second and third capacitors is formed of comb-shaped electrodes opposed to each other along a second opposing direction on the piezoelectric substrate, and the second opposing direction of the comb-shaped electrodes differs from the first opposing direction of the comb-shaped electrodes of the surface acoustic wave resonators;
wherein the piezoelectric substrate is provided with a first grounding conductor disposed at a place not confronting a top face or an underside of the inductor, and the first and second capacitors of the π-shaped LC filter are coupled to the first grounding conductor; and
wherein other inductors coupled to the first and second capacitors respectively are provided by coupling a sec ond grounding conductor embedded in the laminated substrate with the first grounding conductor.

2. The composite filter of claim 1, wherein the piezoelectric substrate is layered on a dielectric substrate and the inductor is embedded in the dielectric substrate.

3. The composite filter of claim 1, wherein comb-shaped electrodes forming the first capacitor and the second capacitor are covered with dielectric.

* * * * *